US012426226B2

(12) United States Patent
Wang et al.

(10) Patent No.: US 12,426,226 B2
(45) Date of Patent: Sep. 23, 2025

(54) MACRO AND SRAM BIT CELL COOPTIMIZATOIN FOR PERFORMANCE (LONG/SHORTWORDLINE COMBO SRAM)

(71) Applicant: Taiwan Semiconductor Manufacturing Company Ltd., Hsinchu (TW)

(72) Inventors: Ping-Wei Wang, Hsinchu (TW); Lien-Jung Hung, Hsinchu (TW); Kuo-Hsiu Hsu, Hsinchu (TW); Kian-Long Lim, Hsinchu (TW); Yu-Kuan Lin, Hsinchu (TW); Chia-Hao Pao, Hsinchu (TW); Chih-Chuan Yang, Hsinchu (TW); Shih-Hao Lin, Hsinchu (TW); Choh Fei Yeap, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 141 days.

(21) Appl. No.: 18/358,562

(22) Filed: Jul. 25, 2023

(65) Prior Publication Data

US 2023/0371225 A1    Nov. 16, 2023

Related U.S. Application Data

(62) Division of application No. 17/842,208, filed on Jun. 16, 2022, now Pat. No. 12,016,169, which is a
(Continued)

(51) Int. Cl.
*H10B 10/00* (2023.01)
*G11C 11/412* (2006.01)
(Continued)

(52) U.S. Cl.
CPC ............ *H10B 10/12* (2023.02); *G11C 11/412* (2013.01); *G11C 11/419* (2013.01); *H01L 22/12* (2013.01);
(Continued)

(58) Field of Classification Search
CPC . G11C 11/412; G11C 11/419; G11C 2213/74; G11C 2213/79; G11C 5/025;
(Continued)

(56) References Cited

U.S. PATENT DOCUMENTS 5,830,797 A * 11/1998 Cleeves ............ H01L 21/76877
257/E21.507
8,194,481 B2   6/2012 Pyeon
(Continued)

FOREIGN PATENT DOCUMENTS

CN   101064297 A   10/2007
CN   103366800 A   10/2013
CN   111128274 A   5/2020

OTHER PUBLICATIONS

Office Action issued in connection with Chinese Appl. No. 202110869914.1 dated Oct. 28, 2024.
(Continued)

*Primary Examiner* — Galina G Yushina
(74) *Attorney, Agent, or Firm* — FOLEY & LARDNER LLP

(57) ABSTRACT

A memory device includes a memory array having a plurality of memory cells. Each memory cell of the plurality of memory cells is connected to a word line to apply a first signal to select the memory cell to read data from or write the data to the memory cell and a bit line to read the data from the memory cell or provide the data to write to the memory cell upon selecting the memory cell by the word line. A first bit line portion of the bit line connected to a first
(Continued)

memory cell of the plurality of memory cells abuts a second bit line portion of the bit line connected to a second memory cell of the plurality of memory cells. The first memory cell is adjacent to the second memory cell.

20 Claims, 7 Drawing Sheets

Related U.S. Application Data division of application No. 16/945,443, filed on Jul. 31, 2020, now Pat. No. 11,393,831.

(51) Int. Cl.
| | | |
|---|---|---|
| *G11C 11/419* | (2006.01) | |
| *H01L 21/66* | (2006.01) | |
| *H01L 23/528* | (2006.01) | |
| *H04N 21/426* | (2011.01) | |
| *H10B 41/35* | (2023.01) | |

(52) U.S. Cl.
CPC ..... *H01L 23/528* (2013.01); *H04N 21/42692* (2013.01); *H10B 10/00* (2023.02); *H10B 41/35* (2023.02); *G11C 2213/74* (2013.01); *G11C 2213/79* (2013.01); *H01L 2924/1437* (2013.01)

(58) Field of Classification Search
CPC .. G11C 5/063; G11C 7/18; G11C 8/14; H10B 10/12; H10B 10/00; H01L 22/12; H01L 23/528; H01L 2924/1437; H04N 21/42692; H10N 41/35; H10D 89/10
See application file for complete search history.

(56) References Cited

U.S. PATENT DOCUMENTS

| | | | |
|---|---|---|---|
| 9,331,062 | B1 | 5/2016 | Lane et al. |
| 9,940,998 | B2 | 4/2018 | Jung et al. |
| 10,043,571 | B1* | 8/2018 | Liaw ..................... G11C 11/417 |
| 10,319,433 | B2 | 6/2019 | Park et al. |
| 11,393,831 | B2* | 7/2022 | Wang ..................... H10B 10/12 |
| 2002/0100920 | A1 | 8/2002 | Yamauchi et al. |
| 2004/0065906 | A1* | 4/2004 | Asao ....................... G11C 11/16 |
| | | | 257/208 |
| 2008/0304313 | A1 | 12/2008 | Fukano |
| 2008/0310220 | A1 | 12/2008 | Tan et al. |
| 2009/0213664 | A1* | 8/2009 | Kikuchi ............... G11C 7/1045 |
| | | | 365/189.011 |
| 2009/0303776 | A1 | 12/2009 | Mair |
| 2012/0072794 | A1 | 3/2012 | Eguchi et al. |
| 2015/0348598 | A1 | 12/2015 | Wang et al. |
| 2016/0240541 | A1 | 8/2016 | Liaw |
| 2016/0254062 | A1 | 9/2016 | Miyanishi et al. |
| 2019/0066773 | A1* | 2/2019 | Park .................... G11C 11/4085 |
| 2019/0097592 | A1 | 3/2019 | Goktepeli |
| 2019/0198507 | A1 | 6/2019 | Nii et al. |
| 2020/0020390 | A1* | 1/2020 | Fujiwara ............... G11C 11/419 |
| 2020/0125693 | A1* | 4/2020 | Frederick, Jr. ........... G11C 7/12 |
| 2020/0372952 | A1* | 11/2020 | Moriwaki ............. H10D 30/43 |

OTHER PUBLICATIONS

Non-Final Office Action on U.S. Appl. No. 17/842,208 DTD Jul. 20, 2023.

Notice of Allowance on U.S. Appl. No. 16/945,443 DTD Mar. 28, 2022.

Taiwan Office Action on TW Appl. Ser. No. 110127320 dated Dec. 28, 2021 (4 pages).

US Office Action on US DTD Apr. 25, 2023.

US Office Action on US Appl. U.S. Appl. No. 16/945,443 dated Nov. 26, 2021 (19 pages).

US Office Action on US Appl. U.S. Appl. No. 16/945,443 dated Oct. 7, 2021 (6 pages).

\* cited by examiner

MACRO AND SRAM BIT CELL COOPTIMIZATOIN FOR PERFORMANCE (LONG/SHORTWORDLINE COMBO SRAM)

CROSS-REFERENCE TO RELATED PATENT APPLICATIONS

This application is a divisional of U.S. patent application Ser. No. 17/842,208, filed on Jun. 16, 2022, which is a divisional of U.S. patent application Ser. No. 16/945,443, now U.S. Pat. No. 11,393,831, filed on Jul. 31, 2020, the entireties of which are incorporated by reference herein.

BACKGROUND

The present disclosure relates generally to memory devices, and particularly to optimized static random-access memory cells.

Memory devices are used in a wide variety of applications. Memory devices are made up of a plurality of memory cells that are typically arranged in an array of a plurality of rows and a plurality of columns. One type of memory cell is a Static Random-Access Memory (SRAM) cell. In some applications, an SRAM cell-based memory device may be preferred over other types of memory cell-based memory devices due to faster speed and reduced power consumption of SRAM cells. As applications require more and more memory, the number of SRAM cells in a memory device is constantly increasing. Additionally, with rising demand for product diversification, co-operation between circuit design and semiconductor manufacturing of SRAM cells is becoming more and more crucial. However, present day SRAM memory cells have limitations in the way those memory cells are configured and how they operate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
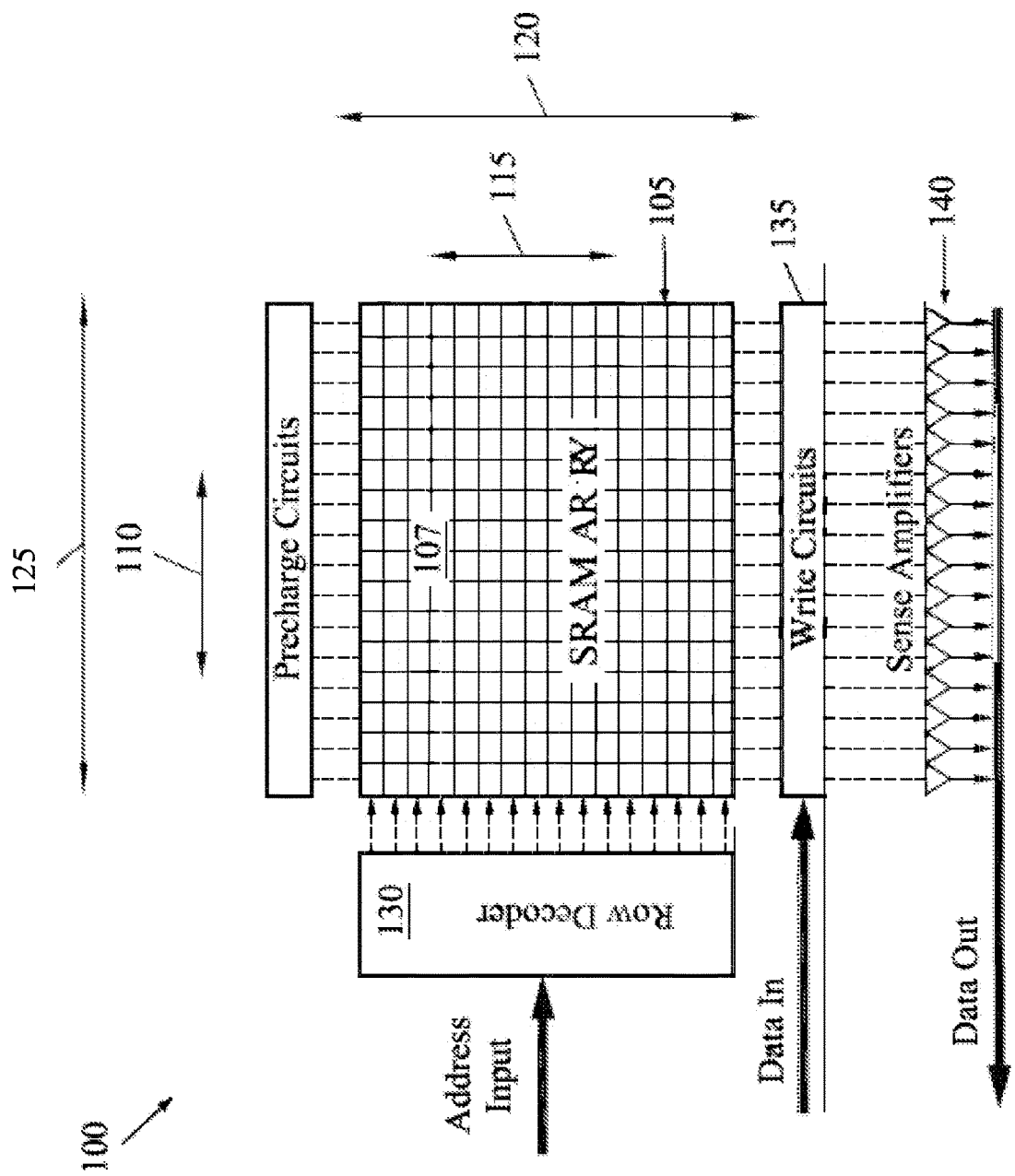
FIG. 1 is an example block diagram of a memory device having an SRAM array, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring now to FIG. 1, an example block diagram of a Static Random-Access Memory ("SRAM") device 100 is shown, in accordance with some embodiments of the present disclosure. The SRAM device 100 includes an SRAM array 105. The SRAM array 105 includes an arrangement of a plurality of SRAM cells 107 arranged in one or more rows that extend along an X direction 110 (also referred to herein as a row direction or word line (WL) direction) and one or more columns that extend in a Y direction 115 (also referred to herein as a column direction or bit line (BL) direction). The number of rows and the number of columns in the SRAM array 105 may depend upon the size of the SRAM array. Generally speaking, larger the size of the SRAM array 105, greater is the number of rows and/or columns in the SRAM array. Depending upon the number of rows, the SRAM array 105 may have a height 120 in the Y direction 115. Similarly, depending upon the number of columns, the SRAM array 105 may have a width 125 in the X direction 110. Each of the plurality of SRAM cells of the SRAM array 105 may also have a height that extends in the Y direction 115 and a width that extends in the X direction 110.

The SRAM device 100 may also include a row decoder 130 coupled to the SRAM array 105. Each SRAM cell of the SRAM array 105 may be connected to a word line that extends in the X direction 110 and a bit line that extends in the Y direction 115. For example, each SRAM cell in a particular row of the SRAM array 105 may be connected to the same word line and each SRAM cell in a particular column of the SRAM array may be connected to the same bit line. Thus, the SRAM array 105 may be coupled to a plurality of word lines and a plurality of bit lines. A "word line" is a conductive line through which a voltage signal of an appropriate voltage level may be applied to a particular SRAM cell to which the word line is connected to select the SRAM cell for either reading data from the SRAM cell or writing data to that SRAM cell. A "bit line" is a conductive line that reads the data from the SRAM cell when that SRAM cell has been selected by the word line or that provides the data to be written to the SRAM cell when that SRAM cell has been selected by the word line. Thus, the word line selects the SRAM cell before data can be read or written to that SRAM cell and the bit line provides the data read from or to be written to that SRAM cell.

The row decoder 130 may be used to select a particular word line of the SRAM array 105. For example, the row decoder 130 may receive an address input and convert that address input into an appropriate word line. In some embodiments, the row decoder 130 may be associated with additional or other types of circuits or elements that facilitate selection of a word line.

The SRAM device 100 may also include write circuits 135 and sense amplifiers 140, which may be used to read data from or provide data to write to a particular SRAM cell of the SRAM array 105 via a bit line. In some embodiments, the write circuits 135 and the sense amplifiers 140 may be associated with latches and/or other circuits that enable reading data from and writing data to a particular SRAM cell. For example, in some embodiments, the data being read from the SRAM array 105 may be sensed by the sense amplifiers 140. In some embodiments, the data being written to the SRAM array 105 may be provided to the write circuits 135 for programming within the SRAM array. The SRAM device 100 may additionally include a control block (not shown) that may be configured to control operation of the row decoder 130, the write circuits 135, the sense amplifiers 140, and any other circuits of the SRAM device 100. It is to be understood that only some components of the SRAM device 100 are shown in FIG. 1. Nevertheless, the SRAM device 100 is intended to include other components that are needed or considered desirable to have in operating the SRAM device and performing the functions described herein.

Figure 2:
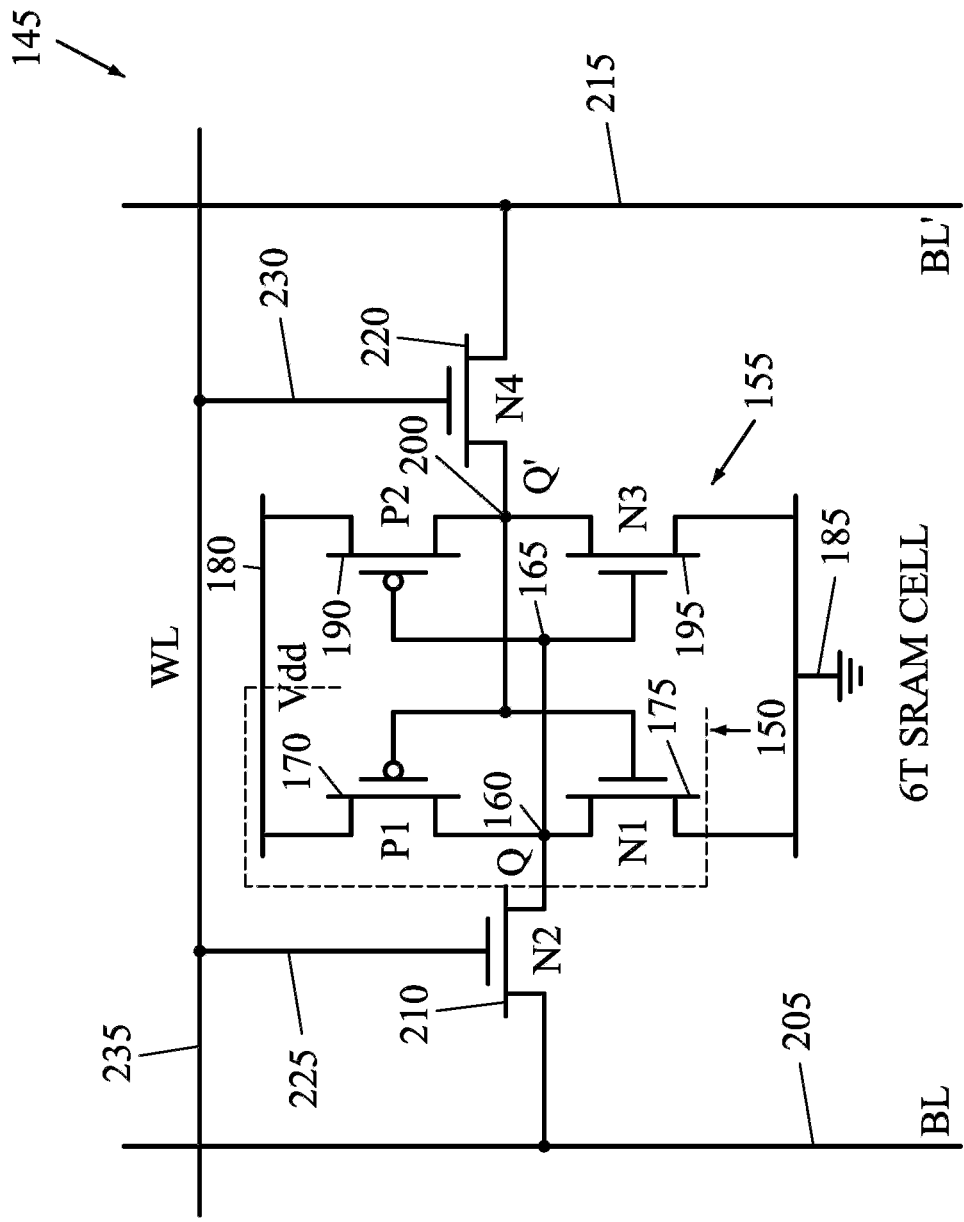
FIG. 2 is an example circuit diagram of an SRAM cell of the SRAM array of FIG. 1, in accordance with some embodiments.

FIG. 2 describes an SRAM cell 145 of the plurality of SRAM cells 107 of the SRAM array 105 in greater detail. In some embodiments, one or more of the plurality of SRAM cells 107 may be a 6-transistor or 6T SRAM cell, an example of which is shown in FIG. 2. A 6T SRAM cell (e.g., the SRAM cell 145) may include six transistors (e.g., metal-oxide-semiconductor (MOS) transistors) configured to store one bit of information. Specifically, the 6T SRAM cell may include two cross-coupled inverters 150 and 155 to form a latch circuit. By cross-coupling the invertors 150 and 155, an output node 160 of the inverter 150 may be connected to an input node 165 of the inverter 155 such that when one of the output nodes (e.g., the output node 160 or the output node of the inverter 155) is pulled to a low voltage level, the other output node transitions to a high voltage level.

The inverter 150 may include a p-type pull-up transistor 170 and an n-type pull-down transistor 175 connected between a supply voltage 180 (e.g., VDD) and a ground voltage 185 (e.g., VSS). The inverter 155 may similarly include a p-type pull-up transistor 190 and an n-type pull-down transistor 195 connected between the supply voltage 180 and the ground voltage 185. The output node 160 of the inverter 150 and an output node 200 of the inverter 155 serve as storage nodes (e.g., from where data stored in the SRAM cell 145 is read or where data written to the SRAM cell is written to). The output node 160 is coupled to a bit line 205 through a first access transistor 210 and the output node 200 is coupled to a bit line 215 through a second access transistor 220. The bit lines 205 and 215 are the same but complementary lines, or in other words, inverse of one another. Gate terminals 225 and 230 of the first access transistor 210 and the second access transistor 220, respectively, are connected to a word line 235.

The voltage level on the word line 235 turns ON and turns OFF the first access transistor 210 and the second access transistor 220 to allow or deny access to the output nodes 160, 200. When the first access transistor 210 and the second access transistor 220 are turned ON, the SRAM cell 145 is considered selected. For example, when the word line 235 is asserted or switched to a high voltage level (e.g., VDD), the first access transistor 210 and the second access transistor 220 are turned ON, allowing the output nodes 160 and 200 to be accessible to the bit lines 205 and 215. When the first access transistor 210 and the second access transistor 220 are ON, data stored at the output nodes 160 and 200 may be read through the bit lines 205 and 215. Similarly, when the first access transistor 210 and the second access transistor 220 are turned ON, data may be written to the output nodes 160 and 200 through the bit lines 205 and 215. When the word line 235 is de-asserted or switched to a low voltage level (e.g., Vss), the first access transistor 210 and the second access transistor 220 are turned OFF and the output nodes 160 and 200 are disconnected from the bit lines 205 and 215. Thus, by adjusting the voltage level at the word line 235, data may be stored or read at the output nodes 160 and 200.

Although the SRAM cell 145 is described herein as a 6T SRAM cell, in other embodiments, the SRAM cell 145 may assume other configurations. For example, in some embodiments, the SRAM cell 145 and other SRAM cells of the SRAM array 105 may be a 4T SRAM cell, 8T SRAM cell, 10T SRAM cell, 12T SRAM cell, etc. In other embodiments, the SRAM cell 145 and the other SRAM cells of the SRAM array 105 may assume any other configuration that is deemed suitable.

Figure 3:
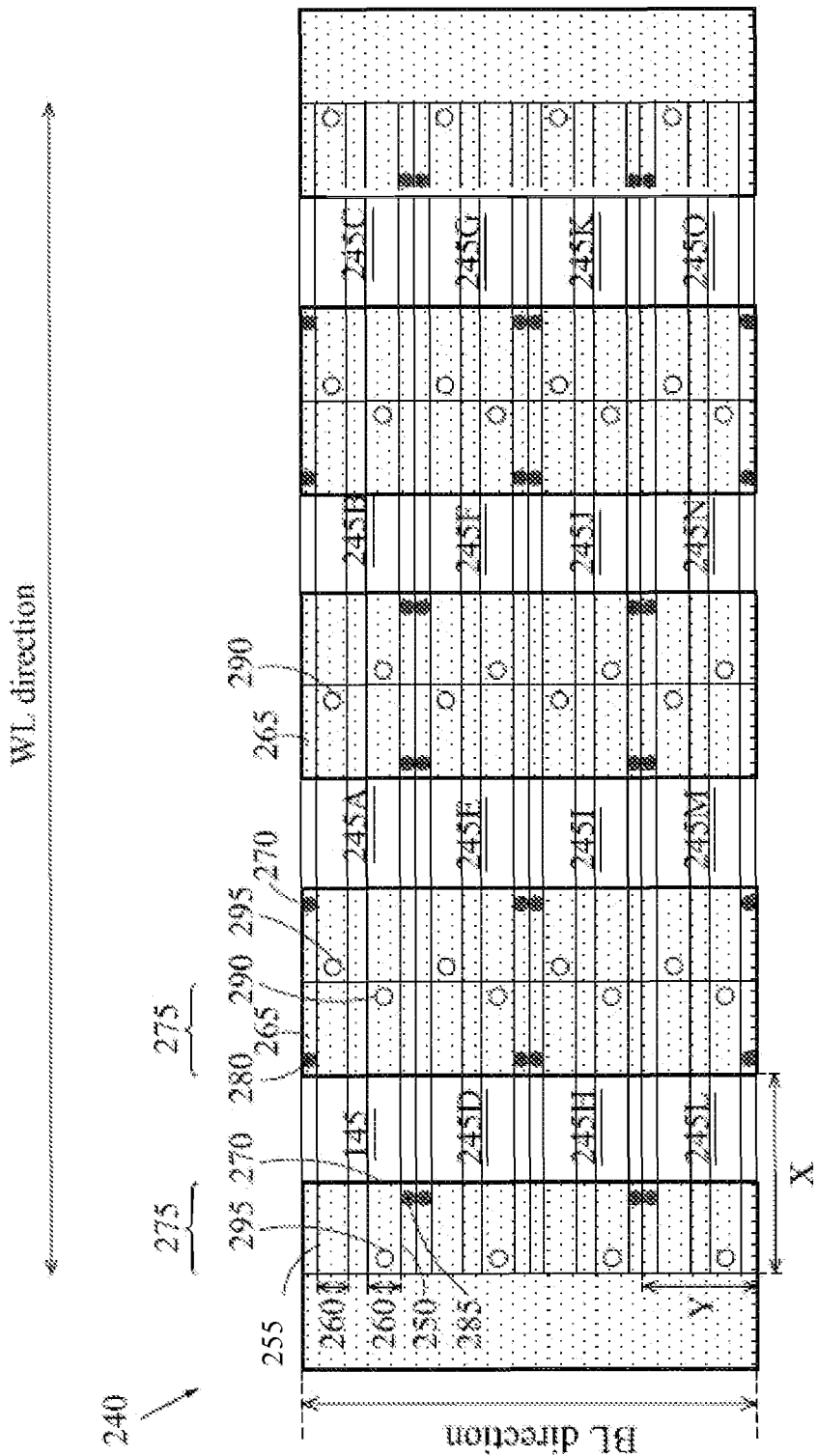
FIGS. 3 and 4 are example block diagrams of a portion of the SRAM array of FIG. 1 showing additional details of the SRAM cell of FIG. 2, in accordance with some embodiments.

Turning now to FIG. 3, an example block diagram of a portion 240 of the SRAM array 105 is shown in greater detail, in accordance with some embodiments of the present disclosure. The portion 240 of the SRAM array 105 includes the SRAM cell 145 and a plurality of additional SRAM cells 245A-245O arranged in an array of rows and columns, as discussed above. In some embodiments, the SRAM cell 145 may be considered to be positioned at row 255 (e.g., the row farthest away from the read/write block 135) and column 0 (e.g., the column closest to the row decoder 130). Thus, the SRAM cell 245A may be considered to be positioned at row 255, column 1, the SRAM cell 245B may be considered to be positioned at row 255, column 2, and so on. The SRAM cell 245D may be considered to be positioned at row 254, column 0, and so on. Although the portion 240 is shown to include 16 SRAM cells, the number of SRAM cells in the portion 240 and the overall SRAM array 105 may vary to include fewer than 16 SRAM cells or greater than 16 SRAM cells. Further, for ease of explanation, the description below is with respect to the SRAM cell 145. However, the description below is equally applicable to each of the SRAM cells 245A-245O also.

As discussed above, the SRAM array 105 includes a plurality of rows and a plurality of columns defining the height 120 and the width 125, respectively, of the SRAM array. Each SRAM cell of the SRAM array 105 connected to a bit line and word line experiences a voltage drop (e.g., current-resistance drop or IR drop) due to current (I) flowing through those bit lines and word lines, as well as the metal resistance (R) offered by those bit lines and word lines. Depending upon the number of rows in the SRAM array 105, the SRAM cells that are farther away from the read/write block 135 experience a greater IR drop than SRAM cells that are closer to the read/write block. For example, the SRAM cell 145, which at row 255 may be the farthest away from the read/write block 135 in some embodiments, may experience a greater IR drop due to the bit line resistance than an SRAM cell at row 0 (which would be closer to the read/write block). Similarly, the SRAM cell 145, which at column 0 is closest to the row decoder 130 in some embodiments, may experience a lower IR drop than an SRAM cell at column 100 (which would be farther away from the row decoder). In some embodiments, the IR drop contributed by the bit line may be more significant than the IR drop contributed by the word line. Longer the bit, greater is the IR drop for the SRAM cells farthest away from the read/write block 135.

Such IR drop adversely impacts the performance (e.g., speed) of those SRAM cells. To reduce the IR drop associated with long bit lines, particularly for those SRAM cells that are farther away from the read/write block 135, such as the SRAM cell 145, the present disclosure provides an optimized SRAM cell in which the widths of the bit line and the word line are adjusted, and a layout design of the SRAM cell is adjusted. Since wider lines have lower IR drop than narrower lines, the present disclosure provides for narrower word lines and wider bit lines to reduce the metal resistance of the long bit line. The configuration of the wider bit lines and narrower word lines may be particularly beneficial for reducing IR drop of those SRAM cells (such as the SRAM cell 145) that are farthest away from the read/write block 135. Thus, in some embodiments, only SRAM cells that are in certain designated rows that are farthest away from the read/write block 130 may be optimized as described herein. In other embodiments, all the SRAM cells regardless of their distance from the read/write block 135 may be optimized as described herein. As noted further below, even SRAM cells that are closest (e.g., row 0) to the read/write block 135 may have increased performance with the optimizations discussed herein.

To optimize the SRAM cell 145, the SRAM cell is connected to two narrow word lines and a wider bit line. For example and as shown in FIG. 3, the SRAM cell 145 is connected to a first word line 250 and a second word line 255, each extending in the X direction 110, spaced apart from one another, and each having a thickness or width 260 in the Y direction 115. The first word line 250 and the second word line 255 may be shared by, and connected to, all the SRAM cells of the SRAM array 105 that are located in the same row (e.g., the row 255) as the SRAM call 145. Further, in some embodiments, the width 260 of the first word line 250 may be same or substantially similar to the width of the second word line 255. In other embodiments, the width 260 of the first word line 250 may be greater than or less than the width of the second word line. Also, in some embodiments, the width 260 of the first word line 250 and/or the second word line 255 may be the same or substantially similar as the widths of the other word lines in rows other than the row (e.g., row 255) in which the SRAM cell 145 is located. In other embodiments, the width 260 of the first word line 250 and/or the second word line 255 may be different from the widths of the other word lines in rows other than the row (e.g., row 255) in which the SRAM cell 145 is located.

The first word line 250 and the second word line 255 may be configured to be connected to the first access transistor 210 and the second access transistor 220 similar to the word line 235. However, as discussed below, in each SRAM cell, either the first word line 250 or the second word line 255 is connected to the first access transistor 210 and the second access transistor 220. By asserting the word line (whether the first word line 250 or the second word line 255) that is connected to the first access transistor 210 and the second access transistor 220, that SRAM cell may be turned ON. Thus, in some embodiments, two word lines (e.g., the first word line 250 and the second word line 255) may be associated with each SRAM cell, but only one of those word lines may be connected to the first access transistor 210 and the second access transistor 220 of the SRAM cell, as shown in FIG. 2.

The SRAM cell 145 is also connected to a bit line corresponding to the bit lines 205 and 215. The bit line includes a first bit line portion 265 and a second bit line portion 270, each extending in the Y direction 115, spaced apart from one another, and each having a width 275 in the X direction 110. The first bit line portion 265 and the second bit line portion 270 may be shared by, and connected to, all the SRAM cells of the SRAM array 105 that are located in the same column (e.g., column 0) as the SRAM call 145. Further, in some embodiments, the width 275 of the first bit line portion 265 may be same or substantially similar to the width of the second bit line portion 270. In other embodiments, the width 275 of the first bit line portion 265 may be greater than or less than the width of the second bit line portion. Also, in some embodiments, the width 275 of the first bit line portion 265 and/or the second bit line portion 270 may be the same or substantially similar as the widths of other bit lines in columns other than the column (e.g., column 0) in which the SRAM cell 145 is located. In other embodiments, the width 275 of the first bit line portion 265 and/or the second bit line portion 270 may be different from the widths of other bit lines in columns other than the column (e.g., column 0) in which the SRAM cell 145 is located.

In some embodiments, the first bit line portion 265 may correspond to the bit line 205 and the second bit line portion 270 may correspond to the bit line 215. In other embodiments, the first bit line portion 265 may correspond to the bit line 215 and the second bit line portion 270 may correspond to the bit line 205. When the SRAM cell 145 is turned ON using the appropriate one of the first word line 250 or the second word line 255, the first bit line portion 265 and the second bit line portion 270 may be used to read data from the SRAM cell or write data to the SRAM cell.

Thus, in some embodiments, the SRAM cell 145 is connected to the first word line 250 and the second word line 255 extending in the X direction 110 and having the width 260 in the Y direction 115. In some embodiments, the SRAM cell 145 is also connected to the first bit line portion 265 and the second bit line portion 270 extending in the Y direction 115 and having the width 275 in the X direction 110. Further, in some embodiments, the width 260 of the first word line 250 and/or the width of the second word line 255 may be less than the width 275 of the first bit line portion 265 and/or the second bit line portion 270. For example, in some embodiments, the width 275 of the first bit line portion 265 may be greater than the width 260 of each of the first word line 250 and the second word line 255. Similarly, in some embodiments, the width 275 of the second bit line portion 270 may be greater than the width 260 of each of the first word line 250 and the second word line 255. For example, in some embodiments, the width 260 of the first word line 250 and/or the second word line 255 may be a function of a cell height (see FIG. 5):

(0.2~0.4)*(cell height)=about 10 nanometers~50 nanometers

In some embodiments, the width 275 of the first bit line portion 265 and/or the second bit line portion 270 may be a function of cell width (see FIG. 5):

(0.4~0.6)*(cell width)=about 80 nanometers~180 nanometers

Thus, the first bit line portion 265 and/or the second bit line portion 270 are wider than the first word line 250 and/or the second word line 255. By providing a wider bit line (e.g., the first bit line portion 265 and the second bit line portion 270), and since wider lines have lower IR drop, the IR drop in the SRAM cells due to the long bit lines may be reduced. A bit line comparison between a 4×4 conventional SRAM array and a 4×4 SRAM array of the present disclosure leads to a bit line loading of 4 bits versus 8 bits of the conventional design. A bit line metal length (e.g., length of the metal interconnect layer) may be 4Y versus 2X (where X:Y=2.5:1, as shown on FIG. 3) of the conventional design. For a same bit line loading of 4 bits, the present disclosure provides a bit line metal length of 4Y versus X of the conventional design, thereby reducing capacitance and resistance (and therefore IR drop) by about 37%. Word line loading comparison between a conventional 4×4 SRAM array and a 4×4 array of the present disclosure leads to a word line loading of 4 bits versus 2 bits of the conventional design. A word line metal length (e.g., length of metal interconnect layer) may be 4X versus 8Y (X:Y=2.5:1) of conventional designs. For a same word line loading (e.g., 4 bits), the present disclosure provides a word line metal length of 4X versus 16Y, which may increase resistance by about 60%.

In some embodiments, the SRAM cell 145 may be configured to include the first word line 250 and the second word line 255, as discussed above, as well as the first bit line portion 265 and the second bit line portion 270, as discussed above. In other embodiments, the SRAM cells in the SRAM array 105 may be configured to include either the first word line 250 and the second word line 255, as discussed above, or the first bit line portion 265 and the second bit line portion 270, as discussed above. For example, in some embodiments, the SRAM cell 145 may have conventional word lines and the bit line may be configured as described herein to have the first bit line portion 265 and the second bit line portion 270. In other embodiments, the SRAM cell 145 may have conventional bit lines and the word line may be configured as described herein to have the first word line 250 and the second word line 255. Such an embodiment may be particularly advantageous for SRAM cells that are farther away from the row decoder 130 but closer to the read/write block 135. In some embodiments, all SRAM cells of the SRAM array 105 may be similarly configured, while in other embodiments, different SRAM cells may have different configurations as described above.

Figure 4:
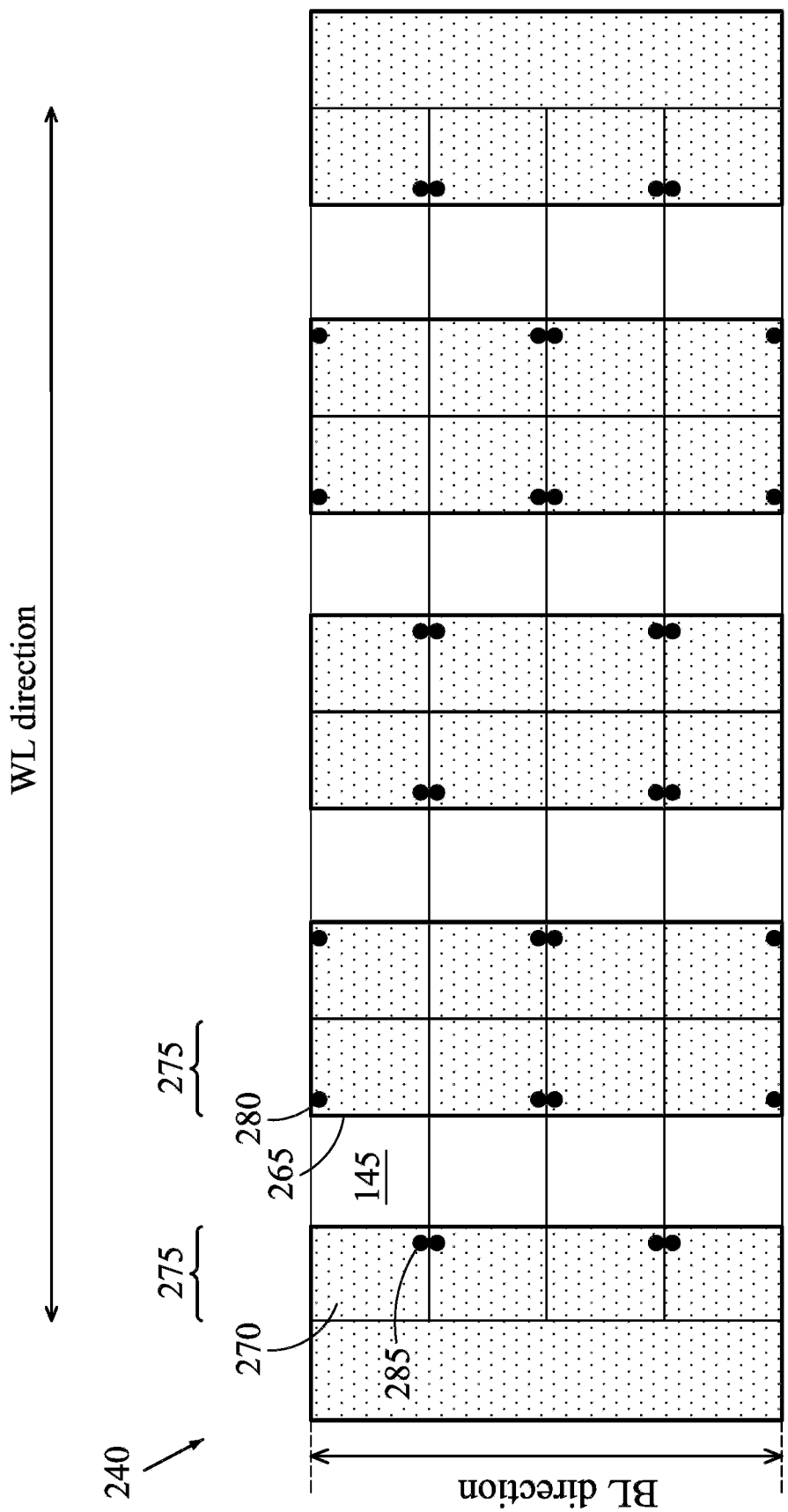

Further, in some embodiments, each of the first bit line portion 265 and the second bit line portion 270 may be configured such that each of those bit line portions are shared with (e.g., abut, join, or connect) a bit line portion of an adjacent SRAM cell in the same row. For example, in some embodiments, the first bit line portion 265 of the SRAM cell 145 may be shared with the second bit line portion 270 of an adjacent SRAM cell (e.g., the SRAM cell 245A) and the first bit line portion of the SRAM cell 245A may be shared with the second bit line portion of the SRAM cell 245B. FIG. 4 shows an example of the portion 240 with the word lines removed for clarity and only showing the first bit line portion 265 and the second bit line portion 270 of the SRAM cells where adjacent bit lines portions are shared. By sharing the bit line portion (e.g., the first bit line portion 265) of one SRAM cell with the bit line portion (e.g., the second bit line portion 270) of an adjacent SRAM cell in the same row, the bit lines may be widened even more and the IR drop of the SRAM cells due to the long bit lines may be further reduced.

However, by sharing a bit line portion of one SRAM cell with a bit line portion of an adjacent SRAM cell in the same row, when the word line (e.g., the first word line 250 and/or the second word line 255) of that row is asserted, both SRAM cells are turned ON and the bit line attempts to read from or write to both SRAM cells, causing erroneous results. To prevent such erroneous results, the present disclosure provides a mechanism by which only one of the two adjacent SRAM cells is turned ON.

Specifically and as shown in FIG. 2, a terminal (e.g., drain terminal) of the first access transistor 210 is connected to the bit line 205, while a terminal (e.g., drain terminal) of the second access transistor 220 is connected to the bit line 215. In some embodiments, to connect the first access transistor 210 to the bit line 205, an interconnect structure (e.g., a via connection) may be needed. For example, in some embodiments, the bit line 205 may be provided using a Metal 0 (or another level) interconnect layer, which may be connected to the first access transistor 210 using the interconnect structure. Similarly, in some embodiments, the bit line 215 may be provided using a Metal 0 (or another level) interconnect layer, which may be connected to the second access transistor 220 using an interconnect structure. The portion 240 of the SRAM array 105 shows the position of such interconnect structures 280 and 285 on the first bit line portion 265 and the second bit line portion 270, respectively, that connect the SRAM cell 145 to the bit lines.

The interconnect structures 280 and 285 are presented on FIGS. 3 and 4 using filled dots. In some embodiments, the interconnect structure 280 may represent a connection of the bit line 205 to the first access transistor 210 and the interconnect structure 285 may represent a connection of the bit line 215 to the second access transistor 220. However, due to the sharing of the first bit line portion 265 and the second bit line portion 270 with the bit line portions of the adjacent SRAM cells, when the SRAM cell 145 and the SRAM cell 245A are both turned ON, erroneous results may occur as discussed above.

To avoid the adjacent SRAM cells from being turned ON, the positioning of the interconnect structures associated with the word lines may be staggered. For example and as shown in FIG. 2, the gate terminal 225 of the first access transistor 210 and the gate terminal 230 of the second access transistor 220 is connected to the word line 235. In some embodiments, the word line 235 may be provided as a Metal 1 (or another level) interconnect layer, and may be connected to the first access transistor 210 and the second access transistor 220 using an interconnect structure such as a via connection. The portion 240 of the SRAM array 105 shows such interconnect structures 290 and 295, represented by unfilled dots, on the first word line 250 in the SRAM cell 245. For example, the interconnect structure 290 may represent the connection to the first access transistor (e.g., the first access transistor 210) and the interconnect structure 295 may represent the connection to the second access transistor (e.g., the second access transistor 220). Both the interconnect structures 290 and 295 are provided on the first word line 250 of the SRAM array 245. However, on the adjacent SRAM cell 245A, the interconnect structures 290 and 295 are provided on the second word line 255. Thus, the positioning of the interconnect structures 290 and 295 is staggered or alternated in the SRAM cells that are located on the same row. By staggering or alternating the positioning of the interconnect structures 290 and 295, those interconnect structures are provided on either the first word line 250 or the second word line 255 of two adjacent SRAM cells. In other words, either the first word line 250 or the second word line 255 of a particular SRAM cell is connected to the first access transistor 210 and the second access transistor 220.

Additionally, in some embodiments, the interconnect structures 290 and 295 are positioned on the same word line on all SRAM cells that share a common column. For example, the interconnect structures 290 and 295, which are positioned on the first word line 250 of the SRAM cell 245, are also positioned on the first word line of each SRAM cell that is located in the same column (e.g., column 0) as the SRAM cell 145. To turn ON the first access transistor (e.g., the first access transistor 210) and the second access transistor (e.g., the second access transistor 220), in some embodiments, both the first word line 250 and the second word line 255 may be asserted. However, since only one of those word lines is connected to the first access transistor 210 and the second access transistor 220 using the interconnect structures 290 and 295, only the word line having the interconnect structures is activated. For example, to select the SRAM cell 145 and not the SRAM cell 245A, the first word line 250 having the interconnect structures 290 and 295, as well as the second word line 255 may both be asserted. However, since the interconnect structures 290 and 295 are only provided on the first word line 250 of the SRAM cell 145, and the adjacent SRAM cell 245A does not have the interconnect structures on the first word line, only the SRAM cell 145 is turned ON even though both the first word line and the second word line are asserted. In other embodiments, to assert the SRAM cell 245, only the first word line 250 having the interconnect structures 290 and 295 may be asserted. This way, since the second word line 255 is not asserted, the SRAM cell 245A is not turned ON.

Figure 5:
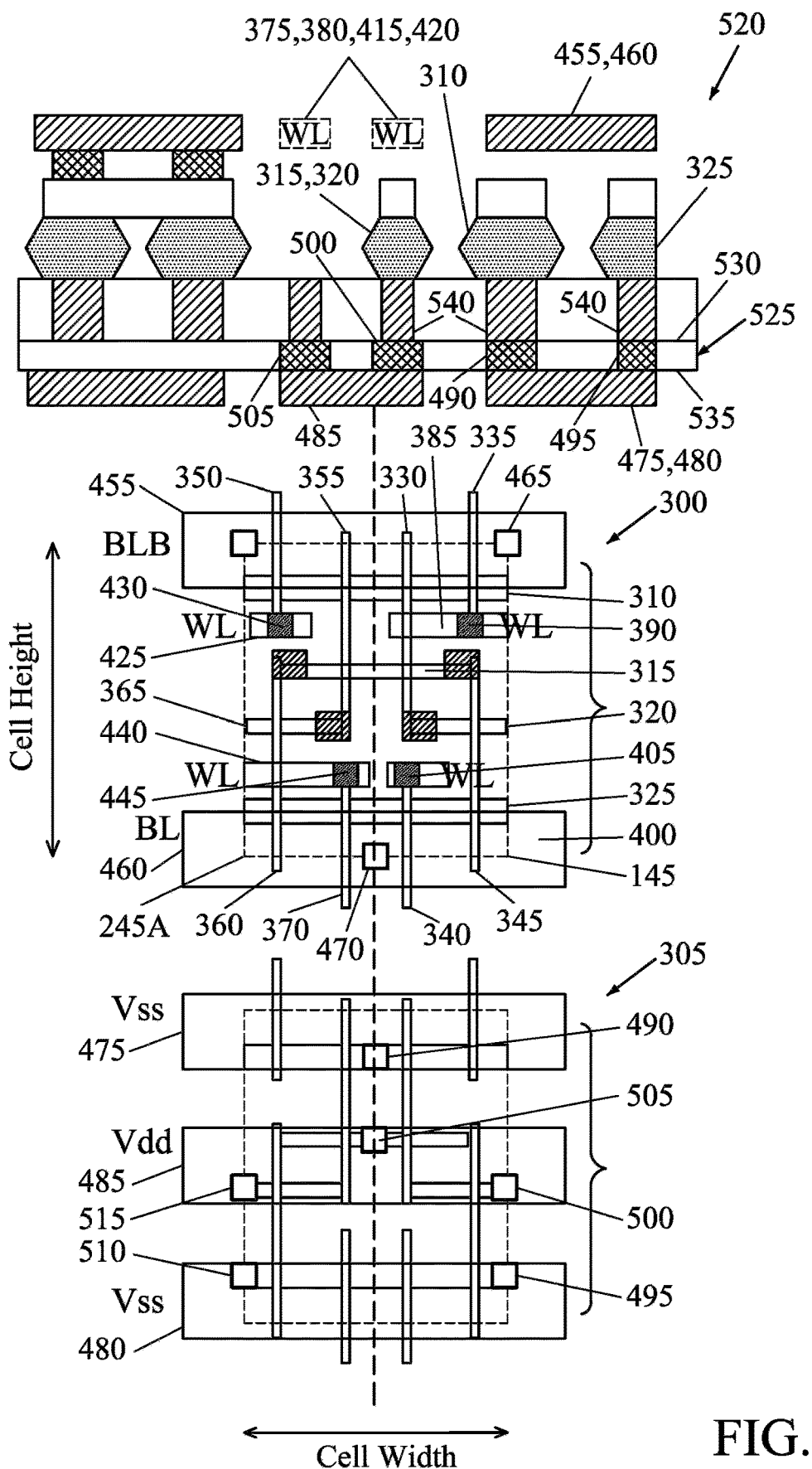
FIGS. 5 and 6 are example standard cell layout designs of two adjacently positioned SRAM cells of the SRAM array of FIG. 1, in accordance with some embodiments.
Figure 6:
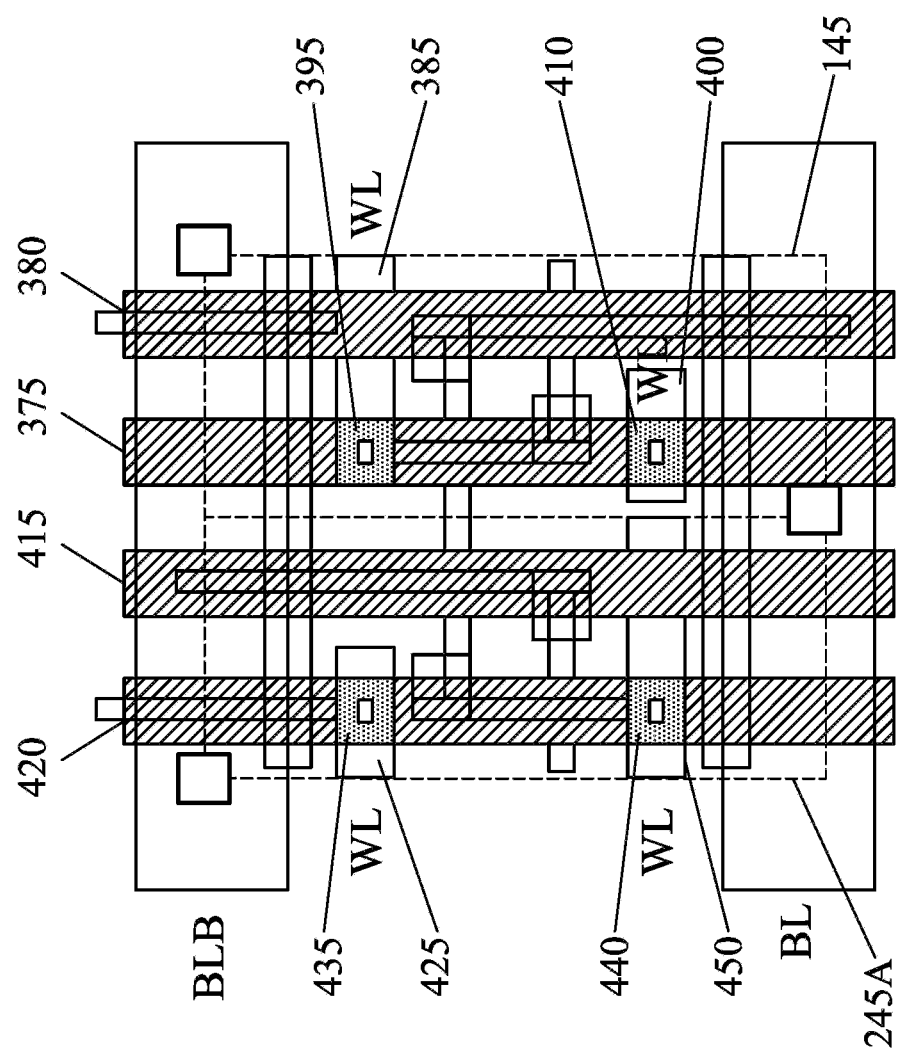

Referring to FIGS. 5 and 6 now, an example layout design and cross-sectional view of a portion of the SRAM array 105 is shown, in accordance with some embodiments of the present disclosure. Specifically, FIG. 5 shows a front side layout design 300 of two adjacent SRAM cells (e.g., the SRAM cells 145 and 245A), a back side layout design 305 of the two adjacent SRAM cells, as well as a cross-sectional view of those SRAM cells showing certain elements of the adjacent SRAM cells. The layout designs 300 and 305 may be used to fabricate at least a portion of a semiconductor device implementing the functionality described in FIGS. 3 and 4 above. The explanation of the layout designs 300 and 305 below is with respect to the SRAM cells 145 and 245A. However, the description is equally applicable to the other SRAM cells of the SRAM array 105.

The layout designs 300 and 305 may define features of active devices (e.g., the transistors 170, 175, 190, 195, 210, 220) of the SRAM cell 145 along an active region. An "active region" may be a fin-shaped region of one or more three-dimensional field-effect-transistors (e.g., FinFETs, gate-all-around (GAA) transistors including nanosheet transistors and nanowire transistors), or an oxide-definition (OD) region of one or more planar metal-oxide-semiconductor field-effect-transistors (MOSFETs). The active region may define source or drain terminals of the active devices (e.g., the transistors noted above). Gate terminals of those transistor may be defined by gate structures, which may be formed of one or more conductive materials (e.g., polysilicon(s), metal(s)), and may overlay respective portions of the active region to define the transistors 170, 175, 190, 195, 210, and 220.

For example, the layout design 300 shows active regions 310, 315, 320, and 325, which define the source and drain regions of the transistors 170, 175, 190, 195, 210, 220. In some embodiments, the active regions 310-325 may extend in an X-direction (e.g., the X-direction 110). The layout design 300 also shows gate structures 330, 335, 340, and 345 overlaying the active regions 310-325 and defining the gate terminals of the transistors 170, 175, 190, 195, 210, 220. In some embodiments, the gate structures 330-345 extend in a Y-direction (e.g., the Y-direction 115). Portions of the active regions 310-325 that are disposed on the left-hand side and right-hand side of a respective one of the gate structures 330-345 may define the source and drain terminal of the transistors 170, 175, 190, 195, 210, 220, respectively.

Specifically, and referring to FIGS. 5 and 6 in conjunction with FIG. 2, the gate structure 330 overlaying the active region 310 defines the gate terminal of the transistor 175, while the portion of that active region on the left hand side and the right hand side of that gate structure defines the source and drain terminals of the transistor 175. Similarly, the gate structure 335 overlaying the active region 310 defines the gate terminal of the transistor 210, with the portion of the active region on the left-hand side and the right-hand side of that gate structure defining the source and drain terminals of that transistor. The gate structure 330 overlaying the active region 315 defines the gate terminal of the transistor 170, with the portion of the active region on the left-hand side and the right-hand side of that gate structure defining the source and drain terminals of that transistor. The gate structure 340 overlaying the active region 325 defines the gate terminal of the transistor 220, with the portion of the active region on the left-hand side and the right-hand side of that gate structure defining the source and drain terminals of that transistor. The gate structure 345 overlaying the active region 325 defines the gate terminal of the transistor 195, with the portion of the active region on the left-hand side and the right-hand side of that gate structure defining the source and drain terminals of that transistor. The gate structure 345 overlaying the active region 320 defines the gate terminal of the transistor 190, with the portion of the active region on the left-hand side and the right-hand side of that gate structure defining the source and drain terminals of that transistor.

Thus, the gate terminal of each of the transistors 170, 175, 190, 195, 210, 220 is defined by one of the gate structures 330-345, and the source and drain terminals of those transistors are defined by the respective one of the active region 310-325 that underlies either side of the gate structure. The SRAM cell 245A has a similar layout design as that of the SRAM cell 145. For example, a gate structure 350 overlaying the active region 310 defines the gate terminal of the first access transistor 210, with the portion of the active region on the left-hand side and the right-hand side of that gate structure defining the source and drain terminals of that transistor. A gate structure 355 overlaying the active region 310 defines the gate terminal of the transistor 175, the gate structure 355 overlaying the active region 315 defines the gate terminal of the transistor 170, and a gate structure 360 overlaying the active region 325 defines the gate terminal of the transistor 195. Similarly, the gate structure 360 overlaying an active region 365 defines the gate terminal of the transistor 190, while a gate structure 370 overlaying the active region 325 defines the gate terminal of the transistor 220. The portions of the respective active regions 310-325, 365 on the left-hand side and the right-hand side of the associated gate structures 350-360, 370 define the source and drain terminals of the respective transistor.

Additionally, the gate terminals 225 and 230 of the first access transistor 210 and the second access transistor 220, respectively, may be connected to the word line 235, as shown in FIG. 2. This connection may be facilitated by electrically connecting the gate structures of the first access transistor 210 and the second access transistor 220 with an interconnect layer representing the word line 235. For example, and as shown in FIG. 5, the gate structure 335 that defines the gate terminal of the first access transistor 210 may be electrically connected to interconnect layers 375 and 380 (shown in FIG. 6) representing the word line 235. In some embodiments, the interconnect layers 375 and 380 may each include a conductive material, such as one or more metal materials, and may be formed using a Metal 1 or M1 layer. In some embodiments, the M1 layer may be formed above a Metal 0 or M0 layer. In some embodiments, the M0 layer may be immediately above the gate structures 330-345, active region, and the M0 layer may be sandwiched between the M1 layer and those gate structures. In other embodiments, the interconnect layers 375 and 380 may be formed at other interconnect levels.

Further, in some embodiments, the M1 layer may extend perpendicular (or substantially perpendicular) to the M0 layer. For example, in some embodiments, the M0 layer may extend in the X-direction 110, while the M1 layer may extend in the Y-direction 115. In other embodiments, the M0 and M1 layers may extend in the same (or substantially similar) direction. Further, in some embodiments, to connect the gate structure 335 to the interconnect layers 375 and 380, that gate structure may be connected to an interconnect layer 385 through an interconnect structure 390. In some embodiments, the interconnect layer 385 may be an M0 layer. In some embodiments, the interconnect structure 390 may be a via structure that provides an electrical connection between the gate structure and the M0 layer. The interconnect layer 385 may then be connected to the interconnect layer 375 through interconnect structure 395 (see FIG. 6), which in some embodiments, may be a via structure. In some embodiments, the interconnect layer 375 may be considered analogous to the first word line 250, while the interconnect layer 380 may be considered analogous to the second word line 255. The interconnect structure 395 may be considered analogous to the interconnect structure 290. Thus, the gate structure 335 defining the gate terminal of the first access transistor 210 is connected to the interconnect layer 375 (e.g., the first word line 250) through the interconnect structure 395 (e.g., the interconnect structure 290).

Similarly, to connect the gate terminal of the second access transistor 220 to the word line 235, the gate structure 340 defining the gate terminal of the second access transistor may be connected to the interconnect layers 375 and 380, shown in FIG. 6. Similar to the interconnection of the gate structure 335, to connect the gate structure 340 to the interconnect layers 375 and 380, the gate structure 340 may be connected to an interconnect layer 400 through an interconnect structure 405. In some embodiments, the interconnect layer 400 may be an M0 layer and the interconnect structure 405 may be a via structure. The interconnect layer 400 may then be connected to the interconnect layer 375 through an interconnect structure 410 (see FIG. 6), which in some embodiments, may be a via structure. Further, in some embodiments, the interconnect structure 410 may be considered analogous to the interconnect structure 295. Thus, the interconnect structures 395 and 410 are both positioned on the interconnect layer 375, which as noted above, may be considered analogous to the first word line 250 in some embodiments.

The layout design 300 also shows the interconnection of the SRAM cell 245A to the word line 235. The word line 235 may include the first word line 250 and the second word line 255. The first word line 250 may be defined by an interconnect layer 415 (see FIG. 6), while the second word line 255 may be defined by an interconnect layer 420 (see FIG. 6). The gate structure 350, which defines the gate terminal of the first access transistor 210 may be connected to the interconnect layer 420. In some embodiments, the interconnect layers 415 and 420 may be defined using M1 layers. The gate structure 350 may be connected to the interconnect layer 420 by connecting to an interconnect layer 425 through an interconnect structure 430. In some embodiments, the interconnect layer 425 may be an M0 layer, while the interconnect structure 430 may be a via structure. The interconnect layer 425 may be connected to the interconnect layer 420 through an interconnect structure 435 (see FIG. 6), which in some embodiments, may be a via structure. In some embodiments, the interconnect structure 435 may be considered analogous to the interconnect structure 290.

To connect the gate structure 370 defining the gate terminal of the second access transistor 220 to the interconnect layer 420, that gate structure may be connected to an interconnect layer 440 through an interconnect structure 445. In some embodiments, the interconnect layer 440 may be an M0 layer and the interconnect structure 445 may be a via structure. The interconnect layer 440 may then be connected to the interconnect layer 420 through another interconnect structure 450 (see FIG. 6). The interconnect structure 450 may also be a via structure. Thus, the interconnect structures 435 and 450 are both provided on the interconnect layer 420, which corresponds to the second word line 255. Thus, the SRAM cell 145 has the interconnect structures 395 and 410 connecting to the interconnect layer 375 (which corresponds to the first word line 250) and the SRAM cell 245A (which is adjacent to the SRAM cell 145) has the interconnect structures 435 and 450 connecting to the interconnect layer 420 (which corresponds to the second word line 255), thus alternating the positioning of the interconnect structures, as discussed in FIG. 3 above.

Further, the first access transistor 210 and the second access transistor 220 are connected to the bit lines 205 and 215, as shown in FIG. 2. This connection is shown in the layout design 300 by virtue of interconnect layers 455 and 460. Specifically, in some embodiments, the active region 310 defining the source and drain terminals of the first access transistor 210 may be connected to the interconnect layer 455 through an interconnect structure 465, while the active region 325 defining the source and drain terminals of the second access transistor 220 may be connected to the interconnect layer 460 through an interconnect structure 470. The interconnect layers 455 and 460 may each be M0 layers (e.g., three metal tracks (e.g., bit line resistance and bit line capacitance) providing larger metal dimension and larger metal space) in some embodiments, while the interconnect structures 465 and 470 may each a via structure in some embodiments. The interconnect layer 455 may correspond to the bit line 205 (e.g., the first bit portion 265), while the interconnect layer 460 may correspond to the bit line 215 (e.g., the second bit portion 270).

By way of the layout design 300, two narrower word lines (e.g., the interconnect layers 375/380 of the SRAM cell 145 and the interconnect layers 415/420 of the SRAM cell 245A) in each SRAM cell may be provided. By alternating the positions of the interconnect structures, as discussed above, on the two narrow word lines, the adjacent SRAM cells may be individually turned ON without turning ON the neighboring SRAM cell. Further, in conventional designs, the active devices (e.g., the transistors), the bit line, the word line, supply voltage, and ground voltage structures are provided on the same side of a semiconductor substrate. Specifically, in conventional designs, the active devices (e.g., the transistors), the bit line, the word line, supply voltage, and ground voltage structures are all provided on the front side or top surface of the semiconductor substrate of the SRAM cell. A "front side" or "top surface" of a semiconductor substrate is the side or surface where the active devices (e.g., the transistors of an integrated circuit (e.g., the SRAM cell 145)) are formed. The side or surface of the semiconductor substrate that is opposite of the front side or top surface is the "back side" or the "bottom surface." The semiconductor substrate is discussed in greater detail below.

By forming all the active devices, bit line, word line, supply voltage, and ground voltage structures on the front side of the semiconductor surface, the overall area of an SRAM cell is increased and higher-level interconnect layers may be needed for some of the structures. For example, in some conventional designs, the supply voltage structures may be defined at the M0 layer along with the bit line structures, and the ground voltage structures may be defined at the M2 layer. Higher interconnect layers may increase the IR drop. Thus, to reduce the overall area of the SRAM cell, as well as further reduce the IR drop, the present disclosure provides a mechanism in which some of the structures may be defined on the back side of the substrate of the SRAM cell. For example, in some embodiments, and as shown in the layout design 300, the active devices (e.g., transistors), the bit line structures, and the word line structures may be formed on the front side of a semiconductor substrate of the SRAM cells 145 and 245O, while the supply voltage and ground voltage structures may be moved to the back side of the semiconductor substrate, as shown in the layout design 305.

Thus, in some embodiments, the layout design 300 corresponds to the layout design on the front side of the semiconductor substrate of the SRAM cells 145 and 245A. The layout design 305 corresponds to the layout design on the back side of the semiconductor substrate of the SRAM cells 145 and 245A. The layout design 305 shows interconnect layers 475 and 480 that define the ground voltage structures corresponding to the ground voltage 185 in FIG. 2, while the interconnect layer 485 defines the supply voltage structure that corresponds to the supply voltage 180 in FIG. 2. In some embodiments, the interconnect layers 475-485 may each be a back side M0 layer. A backside M0 layer may be similar to the front side M0 layer (e.g., the M0 layers described with respect to the layout design 300). Thus, in some embodiments, the backside M0 layer may extend in the X-direction 110. However, the backside M0 layer in some embodiments may be wider than a front side M0 layer. In other embodiments, the interconnect layers 475-485 may each be formed of a different back side metal layer. Since the interconnect layers 475-485 are provided on the back side, those interconnect layers need to be connected to the active devices (e.g., the transistors) formed on the front side, as shown in the layout design 300. In some embodiments, the interconnect layer 475 may be connected to the active region 310 (which is associated with the transistor 175) provided on the front side through an interconnect structure 490. In some embodiments, the interconnect structure 490 may be a via structure. The interconnect structure 490 may be used for both the SRAM cells 145 and 245A. The various active regions and gate structures shown in the layout design 305 correspond to the active regions and gate structures, respectively, that are provided on the layout design 300 and are shown on the layout design 305 only for purposes of explanation. Those active regions and gate structures do not extend to the back side. For example, the active region 310 is shown in the layout design 305 only for ease of explanation. That active region is on the front side as shown in the layout design 300 and does not extend to the back side of the substrate.

Similar to the interconnect layer 475, the interconnect layer 480 may be connected to the active region 325 (which is associated with the transistor 195 of the SRAM cell 145) provided on the front side through an interconnect structure 495. In some embodiments, the interconnect structure 495 may be a via structure. The interconnect layer 485 may be connected to the active region 320 (which is associated with the transistor 190 of the SRAM cell 145) provided on the front side through an interconnect structure 500. The interconnect layer 485 may also be connected to the active region 315 (which is associated with the transistor 170 of the SRAM cells 145 and 245A) provided on the front side through an interconnect structure 505. The interconnect structures 500 and 505 may each be a via structure in some embodiments. Again, the active regions 315, 320, and their associated gate structures are shown in the layout design 305 only for ease of explanation. Those active regions and gate structures are only provided on the front side as shown in the layout design 300.

The interconnect layer 480 may also be connected to the active region 325 (associated with the transistor 195 of the SRAM cell 245A) provided on the front side through an interconnect structure 510. In some embodiments, the interconnect structure 510 may be a via structure. The interconnect layer 485 may also be connected to the active region 320 (which is associated with the transistor 190 of the SRAM cell 245A) provided on the front side through an interconnect structure 515. The interconnect structure 515 may also be a via structure in some embodiments. By providing the supply voltage and ground voltage structures on the back side, the overall area of the SRAM cell may be reduced and resources (e.g., interconnect layers) that may have been used for the power and ground structures on the front side may now be used for other purposes. Further, since the back-side interconnect layers may be wider than the front side interconnect layers, reduced IR drop may be achieved.

Referring still to FIG. 5, a cross-sectional view 520 of a semiconductor device of the SRAM cells 145 and 245A is also shown. The cross-sectional view 520 shows a semiconductor substrate 525 having a front side 530 and a back side 535. The active devices (e.g., transistors) of the SRAM cells 145 and 245A are not shown in the cross-sectional view 520. Thus, the active regions 310-325 and the gate structures 330-345 are not shown in the cross-sectional view 520. The cross-sectional view 520 shows certain interconnect structures and how the front side 330 of the substrate 525 is connected to the back side 535 of the substrate. As discussed above, the supply voltage and ground voltage structures may be moved to the back side 535 of the substrate 525, as shown by the interconnect layers 475/480 for the ground structures and the interconnect layer 485 for the power structure. The ground voltage structures (e.g., the interconnect layers 475/480) may be connected to the structures on the front side of the 530 of the substrate 525 through the interconnect structures 490 and 495. The supply voltage structure (e.g., the interconnect layer 485) may be connected to the structures on the front side 530 of the substrate 525 through the interconnect structures 500, 505.

On the front side 530 of the substrate 525, interconnects 540 may connect the interconnect structures 490, 495, 500, and 505 to the respective active regions 310-325, which may then ultimately be connected to the bit line interconnect layers 455, 460 and the word line interconnect layers 375, 380, 415, and 420.

Figure 7:
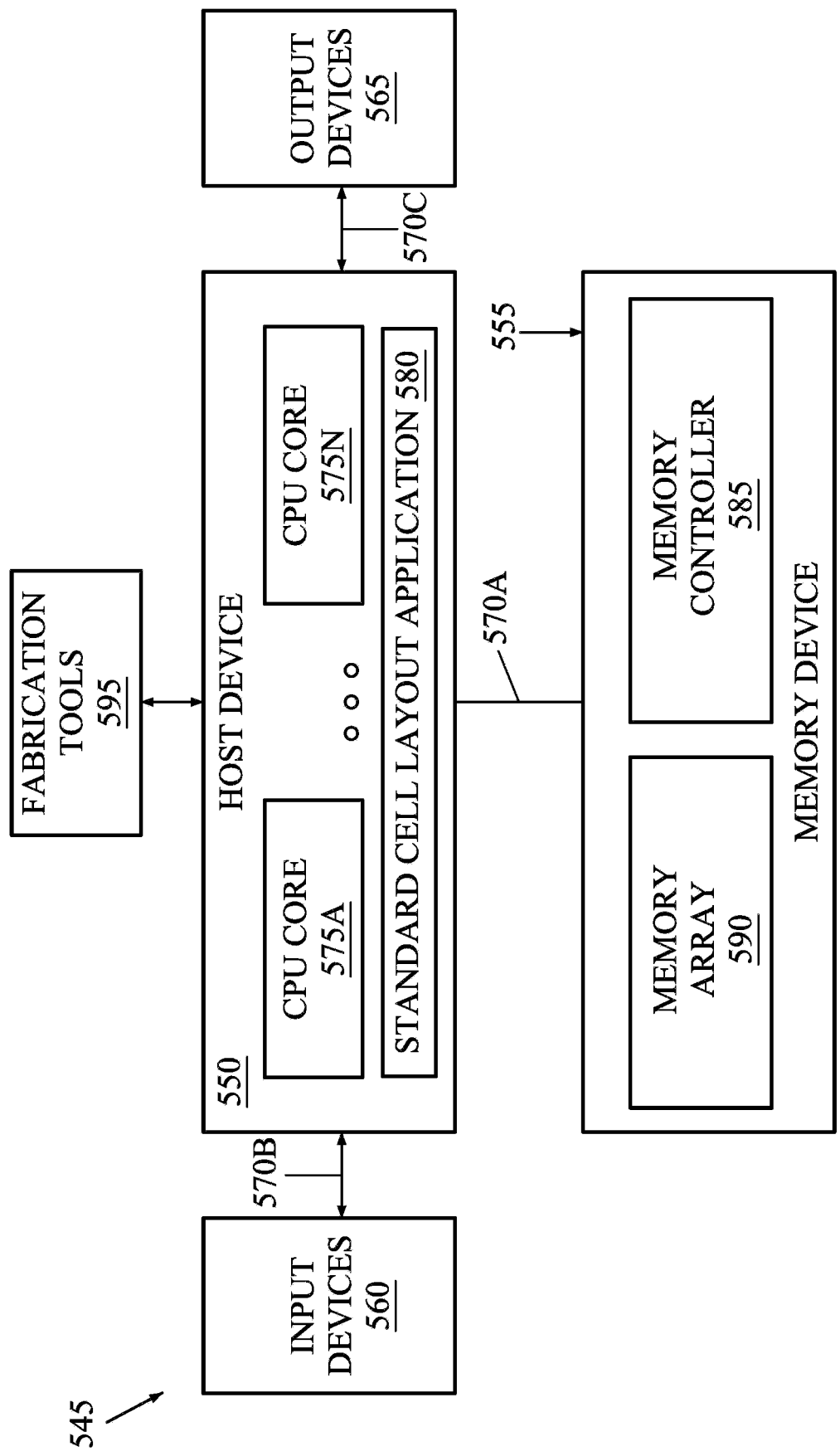
FIG. 7 is an example computing system for creating the standard cell layout designs of FIGS. 5 and 6, in accordance with some embodiments.

Turning to FIG. 7, an example block diagram of a computing system 545 is shown, in accordance with some embodiments of the disclosure. The computing system 545 may be used by a circuit or layout designer for performing a standard cell layout of a circuit. A "circuit" or "integrated circuit" as used herein is an interconnection of active devices (e.g., electrical components) such as resistors, transistors, switches, batteries, inductors, or other types of semiconductor devices configured for implementing a desired functionality. The computing system 545 includes a host device 550 associated with a memory device 555. The host device 550 may be configured to receive input from one or more input devices 560 and provide output to one or more output devices 565. The host device 550 may be configured to communicate with the memory device 555, the input devices 560, and the output devices 565 via appropriate interfaces 570A, 570B, and 570C, respectively. The computing system 545 may be implemented in a variety of computing devices such as computers (e.g., desktop, laptop, servers, data centers, etc.), tablets, personal digital assistants, mobile devices, other handheld or portable devices, or any other computing unit suitable for performing standard cell layout using the host device 550.

The input devices 560 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 550 and that allows an external source, such as a user (e.g., a circuit or layout designer), to enter information (e.g., data) into the host device and send instructions to the host device. Similarly, the output devices 565 may include a variety of output technologies such as external memories, printers, speakers, displays, microphones, light emitting diodes, headphones, video devices, and any other output peripherals that are configured to receive information (e.g., data) from the host device 550. The "data" that is either input into the host device 550 and/or output from the host device may include any of a variety of textual data, circuit data, signal data, semiconductor device data, graphical data, combinations thereof, or other types of analog and/or digital data that is suitable for processing using the computing system 545.

The host device 550 includes or is associated with one or more processing units/processors, such as Central Processing Unit ("CPU") cores 575A-575N. The CPU cores 575A-575N may be implemented as an Application Specific Integrated Circuit ("ASIC"), Field Programmable Gate Array ("FPGA"), or any other type of processing unit. Each of the CPU cores 575A-575N may be configured to execute instructions for running one or more applications of the host device 550. In some embodiments, the instructions and data needed to run the one or more applications may be stored within the memory device 555. The host device 550 may also be configured to store the results of running the one or more applications within the memory device 555. Thus, the host device 550 may be configured to request the memory device 555 to perform a variety of operations. For example, the host device 550 may request the memory device 555 to read data, write data, update or delete data, and/or perform management or other operations.

One such application that the host device 550 may be configured to run may be a standard cell layout application 580. The standard cell layout application 580 may be part of a computer aided design or electronic design automation software suite that may be used by a user of the host device 550 to create a standard cell layout (also referred to herein as "layout," "layout diagram," "layout design," and the like) of a circuit. For example, the standard cell layout application 580 may be used to create the layout designs 300 and 305. A standard cell layout of a circuit may show various components/connections of the circuit to be fabricated. For example, the standard cell layout may show one or more active regions, gate electrodes, source and drain electrodes, metal lines, via contacts, openings for bonding pads, one or more metal layers, power sources, etc. representing the various components of the circuit, and how those components are interconnected when disposed in/on a semiconductor substrate (such as a silicon wafer). The standard cell layout may be implemented by following a design procedure that may include one or more of logic design, physical design, or place and route. The standard cell layout may be expressed in one or more data files such as GDSII file format or DFII file format. In other embodiments, other file formats may be used. Thus, using the standard cell layout application 580, a circuit designer may create a standard cell layout of a circuit. In some embodiments, the instructions needed to execute or run the standard cell layout application 580 may be stored within the memory device 555. The standard cell layout application 580 may be executed by one or more of the CPU cores 575A-575N using the instructions associated with the standard cell layout application from the memory device 555.

Referring still to FIG. 7, the memory device 555 includes a memory controller 585 that is configured to read data from or write data to a memory array 590. In some embodiments, the memory array 590 may include a variety of volatile and/or non-volatile memories. For example, in some embodiments, the memory array 590 may include NAND flash memory cores, NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. Generally speaking, the memory array 590 may include any of a variety of Random Access Memory (RAM), Read-Only Memory (ROM), Programmable ROM (PROM), Erasable PROM (EPROM), Electrically EPROM (EEPROM), hard disk drives, flash drives, memory tapes, optical drives, cloud memory, or any combination of primary and/or secondary memory that is suitable for performing the operations described herein.

The memories within the memory array 590 may be individually and independently controlled by the memory controller 585. In other words, the memory controller 585 may be configured to communicate with each memory within the memory array 590 individually and independently. By communicating with the memory array 590, the memory controller 585 may be configured to read data from or write data to the memory array in response to instructions received from the host device 550. Although shown as being part of the memory device 555, in some embodiments, the memory controller 585 may be part of the host device 550 or part of another component of the computing system 545 and associated with the memory device. The memory controller 585 may be implemented as a logic circuit in either software, hardware, firmware, or combination thereof to perform the functions described herein. For example, in some embodiments, the memory controller 585 may be configured to retrieve the instructions associated with the standard cell layout application 580 stored in the memory array 590 of the memory device 555 upon receiving a request from the host device 550.

In some embodiments, the computing system 545 may also be associated with various fabrication tools 595. Among other things, the fabrication tools 595 may be used to prepare and fabricate a set of masks based on the standard cell layout created by the standard cell layout application 580. The set of masks may define the geometry for the photolithography steps used during semiconductor fabrication of the circuit. Although the fabrication tools 595 are shown separate from the host device 550, in some embodiments, at least some of the functionality of the fabrication tools may be implemented by the host device such as by the standard cell layout application 580 or another application associated with the standard cell layout application.

To prepare a set of masks, the fabrication tools 595 may be used to translate the standard cell layout of the circuit into a representative data file ("RDF"). The RDF may then be used to fabricate a set of physical masks to fabricate the circuit.

In some embodiments, preparing the set of masks may include performing an optical proximity correction (OPC) using lithography enhancement techniques to compensate for image errors, such as those that can arise from diffraction, interference, other process effects and the like, in the standard cell layout. In some embodiments, a mask rule checker (MRC) of the fabrication tools 595 may check the standard cell layout that has undergone processes in OPC with a set of mask creation rules. The mask creation rules may contain certain geometric and/or connectivity restrictions to ensure sufficient margins, to account for variability in semiconductor manufacturing processes, and the like. In some embodiments, the MRC may modify the standard cell layout to compensate for limitations during the fabrication of the set of masks. In some embodiments, preparing the set of masks may also include resolution enhancement techniques (RET), such as off-axis illumination, sub-resolution assist features, phase-shifting masks, other suitable techniques, and the like or combinations thereof.

The preparation of the set of masks may further include, in some embodiments, lithography process checking (LPC) that may simulate processes implemented to fabricate the circuit. LPC may simulate these processes based on the standard cell layout to create a simulated manufactured device of the circuit. LPC may take into account various factors, such as aerial image contrast, depth of focus ("DOF"), mask error enhancement factor ("MEEF"), other suitable factors, and the like or combinations thereof, to simulate the fabrication of the circuit. In some embodiments, after a simulated manufactured device has been created by LPC, if the simulated device does not satisfy certain design rules, OPC and/or MRC may be repeated to further refine the standard cell layout.

To fabricate the set of masks, a mask writer may convert the RDF to an image on a substrate, such as a mask (reticle) or a semiconductor wafer. In some embodiments, an electron-beam (e-beam) or a mechanism of multiple e-beams may be used to form a mask pattern on a semiconductor wafer to form the mask. In some embodiments, the mask pattern may include one or more opaque regions and one or more transparent regions. A radiation beam, such as an ultraviolet (UV) beam, used to expose the image sensitive material layer (e.g., photoresist) which has been coated on the semiconductor wafer, may be blocked by the opaque regions and transmits through the transparent regions. In one example, the mask pattern may include a transparent substrate (e.g., fused quartz) and an opaque material (e.g., chromium) coated in the opaque regions to form the mask. In other embodiments, other or additional techniques may be used to fabricate the masks.

Once the masks are fabricated, a fabrication entity (e.g., a manufacturing facility or semiconductor foundry) may use the fabricated masks to fabricate the circuit. In some embodiments, fabricating the circuit may involve depositing one or more material in/on a semiconductor wafer using the mask (or masks). The semiconductor wafer may include a silicon substrate or other substrate having material layers formed thereon. The semiconductor wafer may further include one or more of various doped regions, dielectric features, multilevel interconnects, and the like formed using one or more of the masks.

It is to be understood that although the fabrication tools 595 are described as performing certain operations for preparing the set of masks and then fabricating the set of masks, in some embodiments, the various processes may vary from those described. In some embodiments, additional or other processes or operations may be used to prepare the set of masks and fabricate the set of masks. It is also to be understood that only some components of the computing system 545 are shown and described in FIG. 7. However, the computing system 545 may include other components such as various batteries and power sources, networking interfaces, routers, switches, external memory systems, controllers, etc. Generally speaking, the computing system 545 may include any of a variety of hardware, software, and/or firmware components that are needed or considered desirable in performing the functions described herein. Similarly, the host device 550, the input devices 560, the output devices 565, and the memory device 555 including the memory controller 585 and the memory array 590 may include other hardware, software, and/or firmware components that are considered necessary or desirable in performing the functions described herein.

Thus, the present disclosure provides an optimized SRAM cell having two narrower word lines and a wider bit line. By having a wider bit line, the IR drop of the SRAM cell is reduced. The reduced IR drop is particularly beneficial for the SRAM cells that are located farther away from the read/write block. The reduced IR drop increases the performance (e.g., speed) of the SRAM cell. For example, in simulations, inventors found that an SRAM cell located at row 0 column 0 of an SRAM array increased in speed by about 102% compared to a conventional SRAM array, an SRAM cell located at row 255, column 0 increased in speed by about 82%, and an SRAM cell located at row 255, column 127 increased in speed by about 131%. Thus, a single wide bit line and two narrow word lines may provide significant performance improvements in some embodiments. Increased performance of the SRAM cells leads to overall increased performance of the SRAM array in which those SRAM cells are employed. Furthermore, by moving the supply voltage and ground voltage structures of the SRAM cell to the back side of a substrate, by providing 2 types of cell metal for different word line and bit line loading, the overall layout design of the SRAM cell may be optimized, thereby further reducing IR drop and reducing the overall size (e.g., area) of the SRAM cell. Although the present disclosure has been described with respect to SRAM cells, it is to be understood that the present disclosure may be applicable to other types of memory cells also.

In accordance with some aspects of the present disclosure, a memory device is disclosed. The memory device includes a memory array having a plurality of memory cells, each of the plurality of memory cells having a first word line to apply a first signal to select the each of the plurality of memory cells to read data from or write the data to the each of the plurality of memory cells, a second word line to apply a second signal to select the each of the plurality of memory cells to read the data from or write the data to the each of the plurality of memory cells, and a bit line to read the data from the each of the plurality of memory cells or provide the data to write to the each of the plurality of memory cells upon selecting the each of the plurality of memory cells by at least one of the first word line or the second word line.

In accordance with some other aspects of the present disclosure, a memory cell is disclosed. The memory cell includes a first word line extending in a first direction and having a first width in a second direction that is perpendicular to the first direction, a second word line extending in the first direction and having a second width in the second direction, and a bit line extending in the second direction and having a third width in the first direction. At least one of the first word line or the second word line applies a signal to select the memory cell to read data from or write the data to the memory cell and the third width is greater than each of the first width and the second width.

In accordance with yet other aspects of the present disclosure, another memory cell is disclosed. The memory cell includes a substrate having a front side and a back side. A transistor of the memory cell is formed on the front side, and the back side is opposite of the front side. The memory cell also includes a first interconnect layer on the front side to provide a bit line of the memory cell, a second interconnect layer on the front side to provide a word line of the memory cell, a third interconnect layer on the back side to provide a supply voltage to the memory cell, and a fourth interconnect layer on the back side to provide a ground voltage to the memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a memory array comprising:
      a first plurality of memory cells in a row extending in a first direction;
      a first word line extending in the first direction and having a first width in a second direction that is perpendicular to the first direction;
      a second word line extending in the first direction and having a second width in the second direction; and
      a plurality of bit line portions extending in the second direction, each of the plurality of bit line portions having a third width in the first direction, the plurality of bit line portions including at least one bit line portion of a first memory cell of the first plurality of memory cells, and at least one bit line portion of a second memory cell of the first plurality of memory cells,
   wherein the third width is greater than each of the first width and the second width, and
   wherein the at least one bit line portion of the first memory cell abuts the at least one bit line portion of the second memory cell.

2. The memory device of claim 1, wherein the at least one bit line portion of the first memory cell includes a first bit line portion and a second bit line portion of the first memory cell, and the at least one bit line portion of the second memory cell includes a first bit line portion and a second bit line portion of the second memory cell, and wherein the first memory cell is connected to the first bit line portion and the second bit line portion of the first memory cell, and the second memory cell is connected to the first bit line portion and the second bit line portion of the second memory cell.

3. The memory device of claim 2, wherein the first memory cell is connected to the first word line through a first interconnect structure and the second memory cell is connected to the second word line through a second interconnect structure.

4. The memory device of claim 3, wherein the first interconnect structure comprises a third interconnect structure and a fourth interconnect structure, and wherein the third interconnect structure is connected to a first access transistor of the first memory cell and the fourth interconnect structure is connected to a second access transistor of the first memory cell.

5. The memory device of claim 4, wherein the second interconnect structure comprises a fifth interconnect structure and a sixth interconnect structure, and wherein the fifth interconnect structure is connected to a first access transistor of the second memory cell and the sixth interconnect structure is connected to a second access transistor of the second memory cell.

6. The memory device of claim 2, wherein the first bit line portion and the second bit line portion of the first memory cell are spaced apart from one another in the first direction.

7. The memory device of claim 1, wherein each of the first plurality of memory cells is a Static Radom Access Memory cell.

8. The memory device of claim 1, wherein the first width is substantially same as the second width.

9. The memory device of claim 1, wherein the third width of each of the plurality of bit line portions is substantially same.

10. The memory device of claim 1, wherein the first word line is spaced apart from the second word line in the second direction.

11. A memory device comprising:
    a memory array comprising a plurality of memory cells including a first memory cell and a second memory cell, each memory cell of the plurality of memory cells connected to:
       a word line extending in a first direction; and
       a bit line extending in a second direction that is perpendicular to the first direction and having a first bit line portion and a second bit line portion, the first bit line portion having a first width in the first direction and the second bit line portion having a second width in the first direction;
    wherein the first width is substantially same as the second width, and wherein the first bit line portion of the first memory cell abuts the second bit line portion of the second memory cell.

12. The memory device of claim 11, wherein the word line has a third width in the second direction, and wherein the third width is lesser than each of the first width and the second width.

13. The memory device of claim 11, wherein each of the plurality of memory cells is a Static Radom Access Memory cell.

14. The memory device of claim 11, wherein the first bit line portion and the second bit line portion of the first memory cell are spaced apart from one another in the first direction.

15. The memory device of claim 11, wherein the word line is a first word line, and wherein the memory device comprises a second word line, each of the first word line and the second word line extending in the first direction, and wherein the first word line is spaced apart from the second word line in the second direction.

16. A memory device comprising:
  a memory array comprising a plurality of memory cells including a first memory cell and a second memory cell, each memory cell of the plurality of memory cells connected to:
    a word line extending in a first direction; and
    a bit line extending in a second direction that is perpendicular to the first direction and having a first bit line portion and a second bit line portion;
  wherein the first bit line portion and the second bit line portion of the first memory cell are spaced apart from one another in the first direction, and the first bit line portion of the first memory cell abuts the second bit line portion of the second memory cell.

17. The memory device of claim 16, wherein each of the plurality of memory cells is a Static Radom Access Memory cell.

18. The memory device of claim 16, wherein the word line is a first word line, and wherein the memory device comprises a second word line, each of the first word line and the second word line extending in the first direction, and wherein the first word line is spaced apart from the second word line in the second direction.

19. The memory device of claim 16, wherein the word line has a first width in the second direction, the first bit line portion of each memory cell of the plurality of memory cells has a second width in the first direction, and the second bit line portion of each memory cell of the plurality of memory cells has a third width in the first direction, and wherein the first width is lesser than the second width and the third width.

20. The memory device of claim 18, wherein the first memory cell is connected to the first word line through a first interconnect structure and the second memory cell is connected to the second word line through a second interconnect structure.

* * * * *